(12) United States Patent
Takeshita et al.

(10) Patent No.: US 6,458,236 B2
(45) Date of Patent: *Oct. 1, 2002

(54) APPARATUS AND METHOD FOR MOUNTING ELECTRICAL PARTS

(75) Inventors: Naoki Takeshita, Fukushima-ken (JP); Manabu Kusano, Fukushima-ken (JP); Fumihiko Sagawa, Fukushima-ken (JP); Taizo Nakagawa, Fukushima-ken (JP)

(73) Assignee: Alps Elctric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/026,313

(22) Filed: Feb. 18, 1998

(30) Foreign Application Priority Data

Feb. 19, 1997 (JP) .............................................. 9-051035
Feb. 19, 1997 (JP) .............................................. 9-051036

(51) Int. Cl.[7] ................................................ C09J 5/10
(52) U.S. Cl. ................... 156/306.9; 29/832; 156/307.5; 156/312; 156/351; 156/358; 156/359; 156/366
(58) Field of Search ............................... 156/307.5, 312, 156/306.9, 351, 358, 359, 366; 29/832

(56) References Cited

U.S. PATENT DOCUMENTS

| 3,453,166 A | * | 7/1969 | Herriott et al. | .............. 156/312 |
| 5,322,586 A | * | 6/1994 | McLean | ...................... 156/358 |
| 5,662,763 A | * | 9/1997 | Yamanaka | ................... 156/358 |
| 5,749,997 A | * | 5/1998 | Tang et al. | .................. 156/312 |
| 6,099,678 A | * | 8/2000 | Kotato et al. | ................ 156/312 |

FOREIGN PATENT DOCUMENTS

JP 4-100248 * 4/1992 .............. 156/306.9

* cited by examiner

*Primary Examiner*—John J. Gallagher
(74) *Attorney, Agent, or Firm*—Brinks Hofer Gilson & Lione

(57) ABSTRACT

An electrical part mounting apparatus includes a pressure measuring member for measuring the pressure of a pressure head, and a moving speed control member for controlling the moving speed of the pressure head. Accordingly, the electrical part mounting apparatus can freely change the pressure and the moving speed of the pressure head to desired values, and is suitable for connection between electrical parts.

4 Claims, 9 Drawing Sheets

APPARATUS AND METHOD FOR MOUNTING ELECTRICAL PARTS

BACKGROUND OF THE INVENTION

1. Field of the Invention

The present invention relates to an electrical part mounting apparatus and method suitable for electrical connection between two electrical parts.

2. Description of the Related Art

Before explaining a conventional electrical part mounting apparatus and method, the structure in which electrical parts are connected will be described with reference to FIGS. 11A and 11B.

As shown in FIGS. 11A and 11B, a plurality of conductive wires 2 and 3, each formed of an ITO film (a transparent resistive film made of indium tin oxide) or the like, are formed on an insulating plate 1 of glass or the like, thereby constituting an electrical part 4.

A plurality of conductive members (bumps) 6 and 7 are formed on the lower surface of a frame 5, thereby constituting another electrical part 8 such as an IC chip.

The conductive members 6 and 7 of the electrical part 8 are placed opposed to the conductive wires 2 and 3 on the insulating plate 1, and the electrical parts 4 and 8 are bonded to each other by a thermosetting anisotropic conductive material 10 made of a thermosetting epoxy adhesive containing conductive particles 9, or the like. The conductive members 6 and the conductive wires 2, and the conductive members 7 and the conductive wires 3, which are aligned vertically, are connected via the conductive particles 9.

A conventional electrical part mounting apparatus and method for obtaining such a connecting structure will be described with reference to FIGS. 17 to 20.

The conventional electrical part mounting apparatus is, as shown in FIGS. 17 to 20, provided with a flat support 50, and a pressure head 51 having a flat lower surface and supported movably in the vertical direction with respect to the support 50. The pressure head 51 is lowered by a hydraulic cylinder (not shown) at a fixed speed while being heated.

The electrical part mounting method employed in such a mounting apparatus will be described with reference to FIGS. 17 to 20.

As shown in FIG. 17, the electrical part 4, the thermosetting anisotropic conductive material 10 shaped like a film (hereinafter abbreviated as ACF), and the electrical part 8 are laid in order on the flat support 50.

In the first step, the pressure head 51, which has been heated to about 220° C., is moved downward by the hydraulic cylinder at a fixed moving speed (about 30 mm/sec) that is somewhat slow, and brought into contact with the electrical part 8, as shown in FIG. 18.

The fixed moving speed is set to be somewhat slow so that the electrical parts 4 and 8 are not damaged.

In the second step, a fixed pressure is applied to the pressure head 51 to press the electrical part 8.

The electrical part 8 is heated by the heated pressure head 51, and then, the ACF 10 is heated to a liquid state by the heated electrical part 8.

As a result, the pressure head 51 moves down and the conductive particles 9 sandwiched between the conductive wires 2 and 3 and the conductive members 6 and 7 are crushed, so that the conductive wires 2 and 3 are electrically connected to the conductive members 6 and 7, respectively, as shown in FIG. 11B.

In the third step, the heated pressure head 51 is cooled.

Then, the ACF 10 is set, the electrical parts 4 and 8 are bonded to each other, and the conductive wires 2 and 3 are connected to the conductive members 6 and 7, respectively.

In the fourth step, the pressure head 51 is moved up, and mounting of the electrical parts is completed.

As mentioned above, in the conventional electrical part mounting apparatus and method, since the heated pressure head 51 moves a fixed moving speed that is somewhat slow, working efficiency is low, which results in low productivity.

Furthermore, since the pressure head 51 is brought into contact with the electrical part 8 at the fixed slow moving speed, parallelism between the flat lower surface of the pressure head 51 and the flat surface of the support 50 is impaired. Moreover, since the pressure head 51 presses the electrical part 8 with a fixed pressure in this state, it presses the electrical part 8, the ACF 10, and the electrical part 4 without sufficient parallelism.

When the ACF 10 is liquefied in this state, the conductive particles 9 are crushed at one end of the electrical parts, and are not crushed at the other end. This causes unstable electrical connection between the conductive wires 2 and 3 and the conductive members 6 and 7, respectively.

Furthermore, since the ACF 10 is abruptly liquefied by the heated pressure head 51 in the conventional electrical part mounting method, the adhesive therein expands and bubbles are produced between the electrical parts 4 and 8, which decreases the adhesive force between the electrical parts 4 and 8.

Still furthermore, air is left between the electrical parts 4 and 8 due to abrupt liquefaction, and turned into bubbles, which also weakens the adhesion between the electrical parts 4 and 8.

In addition, since the pressure head 51 descends rapidly due to abrupt liquefaction, it cannot move straight in the vertical direction. Therefore, the conductive particles 9 are crushed at one end of the electrical parts and not crushed at the other end, which results in unstable electrical connection between the conductive wires 2 and 3 and the conductive members 6 and 7, respectively.

SUMMARY OF THE INVENTION

Accordingly, it is an object of the present invention to provide an electrical part mounting apparatus and method suitable for electrical connection between two electrical parts that can freely adjust the pressure and moving speed of a pressure head.

According to a first aspect of the present invention, there is provided an electrical part mounting apparatus including a pressure head for pressing an electrical part, a heater for heating the pressure head, a pressure measuring member for measuring the pressure of the pressure head against the electrical part, and a moving speed control member for controlling the moving speed of the pressure head.

The electrical part mounting apparatus may further include a timer for measuring the pressing time and/or the heating time of the pressure head for the electrical part, and a temperature control member for controlling the temperature of the heater.

According to a second aspect of the present invention, there is provided an electrical part mounting method wherein a heated pressure head for pressing an electrical part laid on a thermosetting anisotropic conductive material presses the electrical part while gradually increasing the pressure to a required pressure.

According to a third aspect of the present invention, there is provided an electrical part mounting method wherein a heated pressure head for pressing an electrical part laid on a thermosetting anisotropic conductive material presses the electrical part while increasing the pressure stepwise to a required pressure.

According to a fourth aspect of the present invention, there is provided an electrical part mounting method wherein a heated pressure head for pressing an electrical part laid on a thermosetting anisotropic conductive material presses the electrical part with a first pressure applied thereto, and then presses the electrical part with a second pressure higher than the first pressure.

Preferably, the first pressure is about ⅓ of the second pressure.

According to a fifth aspect of the present invention, there is provided an electrical part mounting method wherein a pressure head is lowered at high speed near an electrical part laid on a thermosetting anisotropic conductive material, and then, lowered gently until it is brought into light contact with the electrical part.

According to a sixth aspect of the present invention, there is provided an electrical part mounting method wherein two electrical parts are electrically connected by semi-setting a thermosetting anisotropic conductive material and then, heating and pressing the semi-set thermosetting anisotropic conductive material.

According to a seventh aspect of the present invention, there is provided an electrical part mounting method including the steps of forming a semi-set thermosetting anisotropic conductive material on an insulating plate with a conductive wire, and heating and pressing an electrical part, such as an IC chip, on the semi-set thermosetting anisotropic conductive material.

Preferably, the thermosetting anisotropic conductive material is laid in the form of a sheet on the insulating plate and semi-set by being heated and pressed by a pressure head, and the electrical part is heated and pressed by the pressure head.

Preferably, the temperature at which the electrical part is heated is higher than the heating temperature to semi-set the thermosetting anisotropic conductive material.

Preferably, the thermosetting anisotropic conductive material is semi-set at 80° C. to 120° C. and the electrical part is heated at 180° C. to 250° C.

DESCRIPTION OF THE PREFERRED EMBODIMENTS

Before explaining an electrical part mounting apparatus and method according to the present invention, the connecting structure of electrical parts to which the mounting method is applied will be described with reference to FIGS. 11 and 12.

Figure 11A:
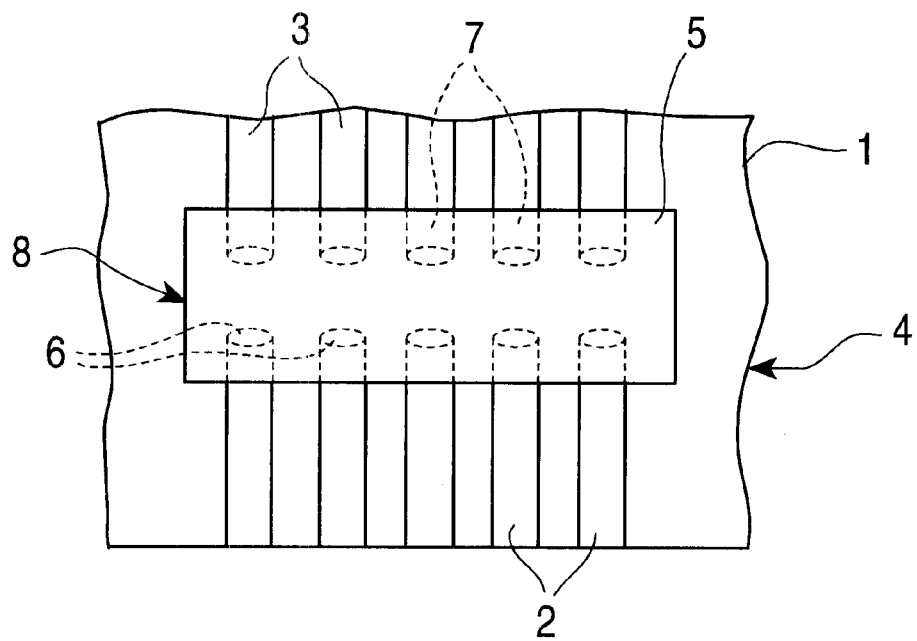
FIGS. 11A and 11B are explanatory views showing a connecting structure of electrical parts to which the mounting method of the present invention is applied.
Figure 11B:
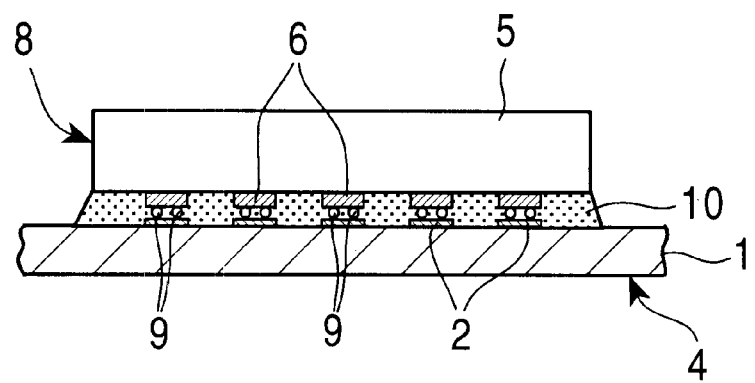

FIGS. 11A and 11B are respectively plan and cross-sectional views showing the principal part of a connecting structure of electrical parts to which the mounting method of the present invention is applied. In the connecting structure shown in FIGS. 11A and 11B, as mentioned above, a plurality of conductive wires 2 and 3, each formed of an ITO film (a transparent resistive film made of indium tin oxide) or the like, are formed on an insulating plate 1 made of glass or the like, thereby constituting an electrical part 4.

A plurality of conductive members (bumps) 6 and 7 are formed on the lower surface of a frame 5, thereby constituting another electrical part 8 such as an IC chip.

The conductive members 6 and 7 of the electrical part 8 are placed opposed to the conductive wires 2 and 3 on the insulating plate 1, the electrical parts 4 and 8 are bonded to each other by a thermosetting anisotropic conductive film (hereinafter abbreviated as ACF) 10 made of thermosetting epoxy adhesive or the like that contains conductive particles 9, and the conductive members 6 and 7 and the conductive wires 2 and 3, which are aligned in the vertical direction, are connected through the conductive particles 9.

Figure 12A:
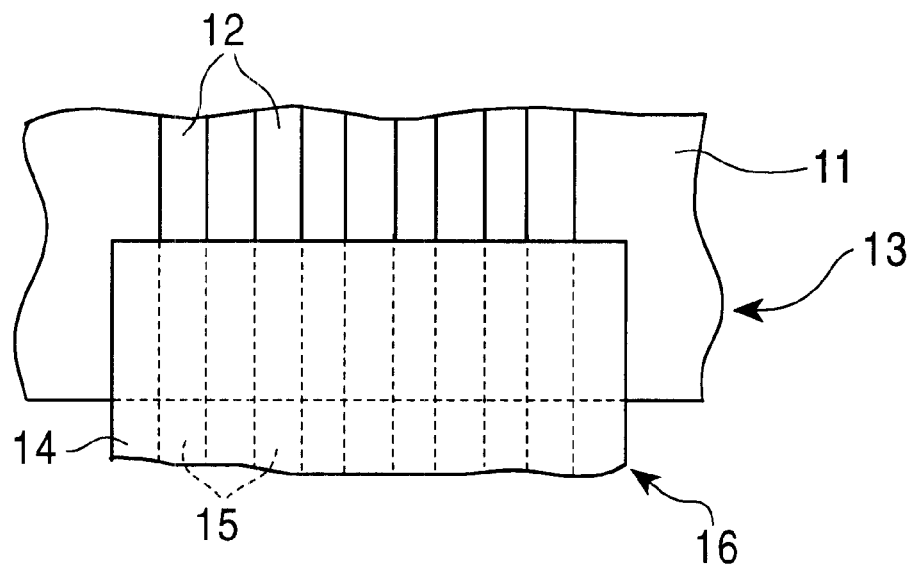
FIGS. 12A and 12B are explanatory views showing another connecting structure of electrical parts to which the mounting method of the present invention is applied.
Figure 12B:
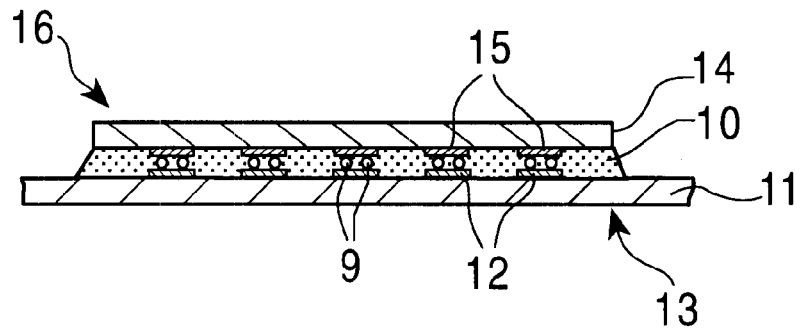

FIGS. 12A and 12B are respectively plan and cross-sectional views showing the principal part of another connecting structure of electrical parts to which the mounting method of the present invention is applied. As shown in FIGS. 12A and 12B, a plurality of conductive wires 12 made of silver or the like are formed on a flexible insulating plate 11, thereby constituting an electrical part 13. A plurality of conductive wires 15 made of silver or the like are also formed on a flexible insulating plate 14, thereby constituting another electrical part 16.

The conductive wires 15 of the electrical part 16 are placed opposed to the conductive wires 12 of the other electrical part 13, the electrical parts 13 and 16 are bonded to each other by an ACF 10 made of thermosetting epoxy adhesive or the like that contains conductive particles 9, and the conductive wires 15 and 12, which are aligned vertically, are connected through the conductive particles 9.

Figure 1:
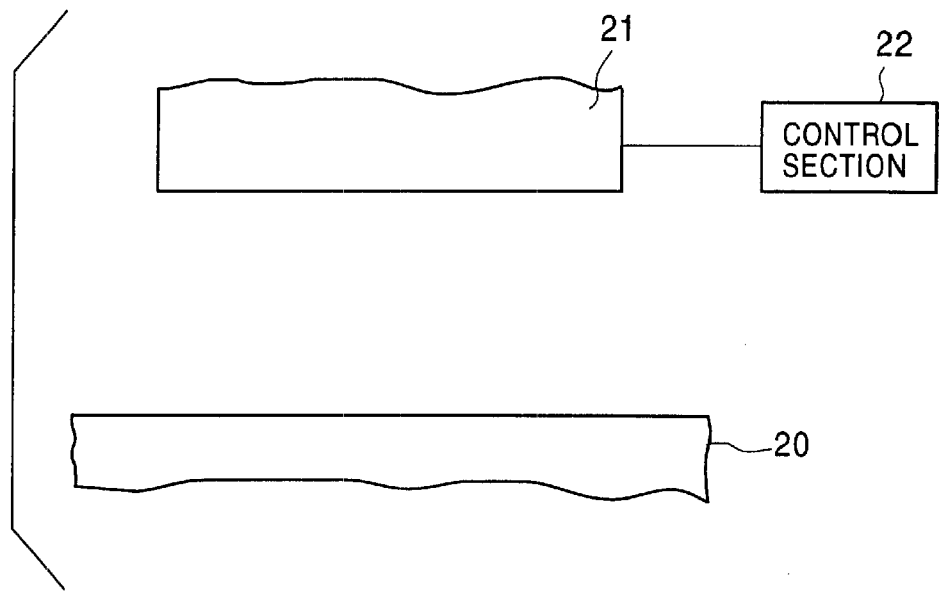
FIG. 1 is a schematic structural view of an electrical part mounting apparatus according to a first embodiment of the present invention.
Figure 2:
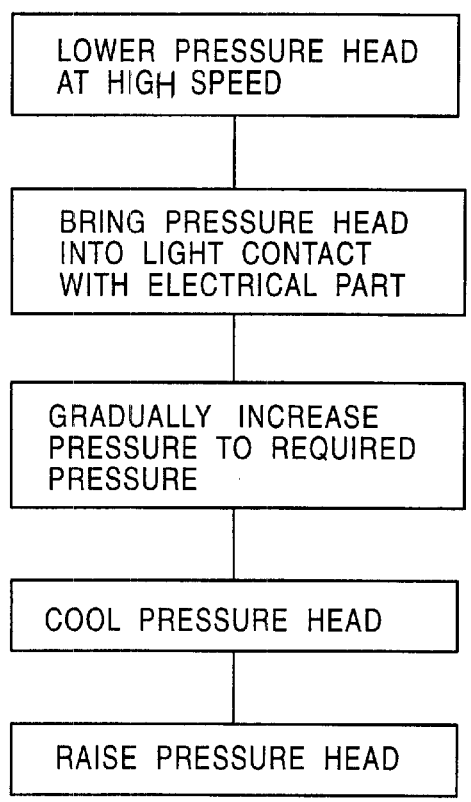
FIG. 2 is an explanatory view showing steps in an electrical part mounting method according to the first embodiment.

An electrical part mounting apparatus for obtaining such a connecting structure according to a first embodiment of the present invention will be described with reference to FIG. 1. The mounting apparatus comprises a support 20 having a flat surface, a pressure head 21 having a flat lower surface and capable of being moved up and down by a servomotor with respect to the support 20, and a control section 22 linked with the pressure head 21.

The control section 22 comprises a temperature control member for controlling a heater used to heat the pressure head 21, a moving speed control member for controlling the moving speed of the pressure head 21, a pressure measuring member for measuring the pressure of the pressure head 21, and a timer for measuring the pressing time and heating time of the pressure head 21.

Next, an electrical part mounting method according to the first embodiment of the present invention will be described with reference to FIGS. 2 to 5 in connection with the connecting structure of electrical parts shown in FIG. 11.

Figure 3:
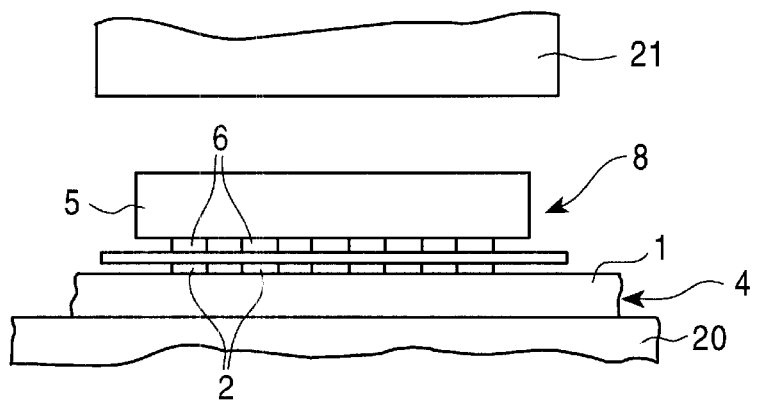
FIG. 3 is an explanatory view showing the electrical part mounting method of the first embodiment.

FIGS. 2 to 5 each show the electrical part mounting method of the first embodiment. In the mounting method, an electrical part 4, an ACF 10, and an electrical part 8 are laid on the flat support 20 in order, as shown in FIG. 3.

Then, in the first step, the pressure head 21, which has been heated to about 220° C., is lowered close to the electrical part 8 via the moving speed control member at high speed (about 20 mm/sec).

Figure 4:
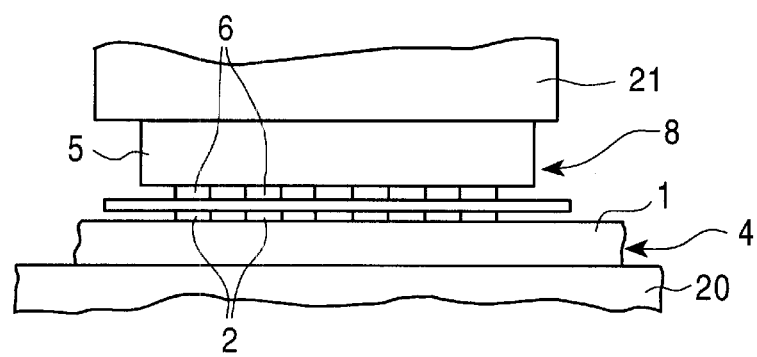
FIG. 4 is an explanatory view showing the electrical part mounting method of the first embodiment.

In the second step, the pressure head 21 is moved downward gently (at a speed of about 20 $\mu$m/sec) from the above-mentioned state via the moving speed control member until it is brought into light contact with the electrical part 8, as shown in FIG. 4.

This step substantially restricts shaking of the pressure head 21 during movement, and the flat surface thereof is brought into light contact with the electrical part 8 in parallel with the flat surface of the support 20.

In the third step, as shown in FIG. 4, pressure is applied to the pressure head 21 via the pressure measuring member and the timer so that the pressure gradually increases to a required pressure in a required time, thereby pressing the electrical part 8 through the pressure head 21.

When the pressure reaches the required pressure, the electrical part 8 is pressed by the pressure head 21 with the required pressure for a fixed time.

In this step, since the electrical part 8 is pressed while the pressure is gradually increased to the required pressure, parallelism between the flat surface of the pressure head 21 and the flat surface of the support 20 is improved, and the pressure head 21 is moved downward while maintaining this parallel state.

After being pressed by the pressure head 21 with the required pressure for the fixed time, the electrical part 8 is heated by the heated pressure head 21, and then, the ACF 10 is heated and liquefied by the heated electrical part 8.

As a result of liquefaction of the ACF 10, the pressure head 21 descends, the conductive particles 9 between the conductive wires 2 and 3 and the conductive members 6 and 7 are crushed, and the conductive wires 2 and 3 are electrically connected to the conductive members 6 and 7, respectively, as shown in FIG. 11B.

Next, the pressure head 21 is cooled in the fourth step.

In this step, the ACF 10 is set, the electrical parts 4 and 8 are bonded to each other, and the conductive wires 2 and 3 are connected to the conductive members 6 and 7, respectively, as shown in FIG. 11B.

Figure 5:
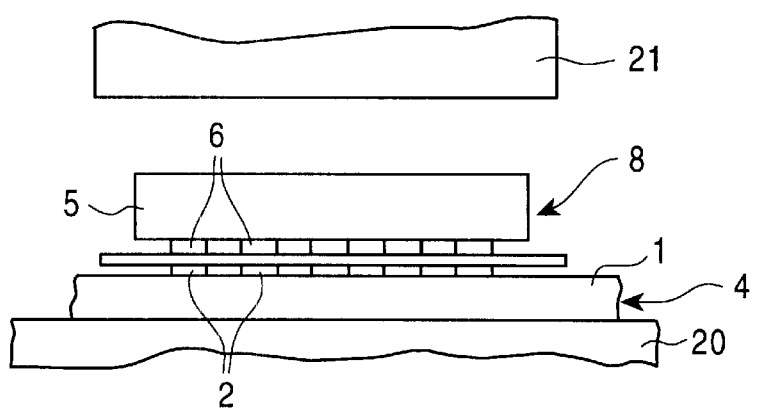
FIG. 5 is an explanatory view showing the electrical part mounting method of the first embodiment.

In the fifth step, the pressure head 21 is moved upward as shown in FIG. 5, and mounting of the electrical parts is completed.

Although the pressure applied to the pressure head 21 is gradually increased to the required pressure in the third step of the above embodiment, even if it is increased to the required pressure in a stepwise manner, similar functions are obtained.

Figure 6:
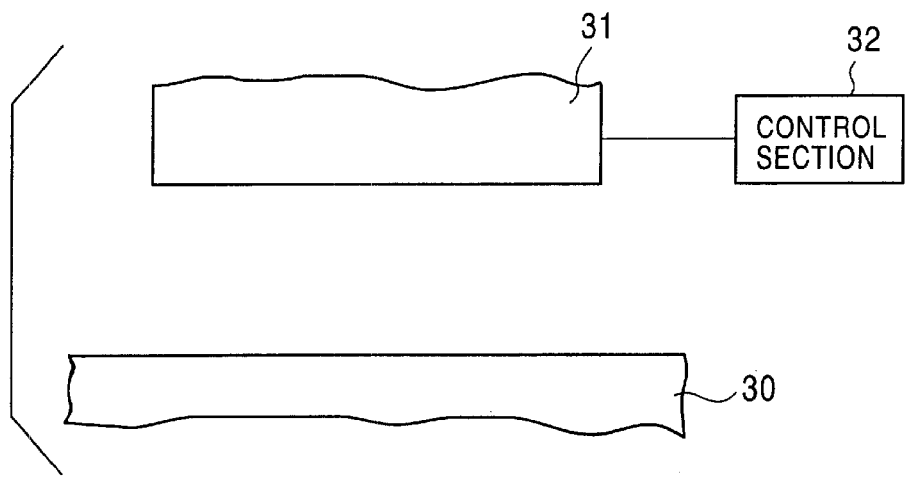
FIG. 6 is a schematic structural view of an electrical part mounting apparatus according to a second embodiment of the present invention.
Figure 7:
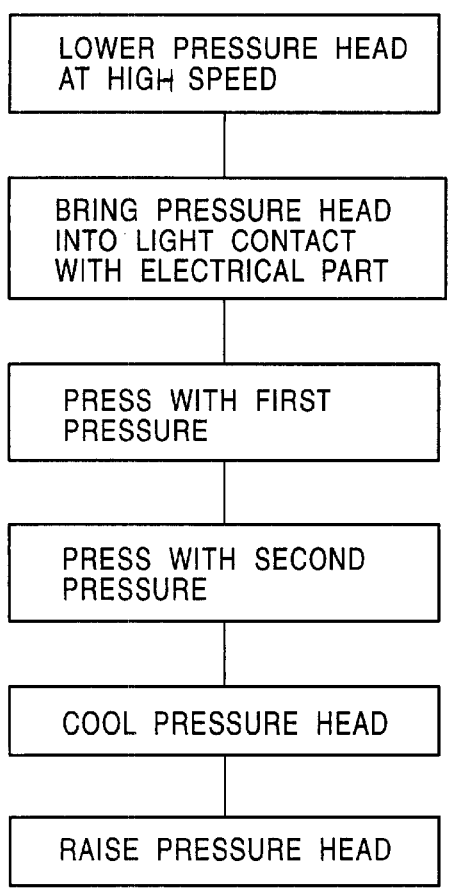
FIG. 7 is an explanatory view showing steps in an electrical part mounting method according to the second embodiment.

An electrical part mounting apparatus according to a second embodiment of the present invention will now be described with reference to FIG. 6. Similarly to the above-mentioned first embodiment, the mounting apparatus of the second embodiment comprises a support 30 having a flat surface, a pressure head 31 having a flat lower surface and capable of being moved up and down by a servomotor with respect to the support 30, and a control section 32 linked with the pressure head 31.

The control section 32 comprises a temperature control member for controlling a heater used to heat the pressure head 31, a moving speed control member for controlling the moving speed of the pressure head 31, a pressure measuring member for measuring the pressure of the pressure head 31, and a timer for measuring the pressing time and heating time of the pressure head 31.

Next, an electrical part mounting method according to the second embodiment of the present invention will be described with reference to FIGS. 7 to 10 in connection with the connecting structure of electrical parts shown in FIG. 11.

Figure 8:
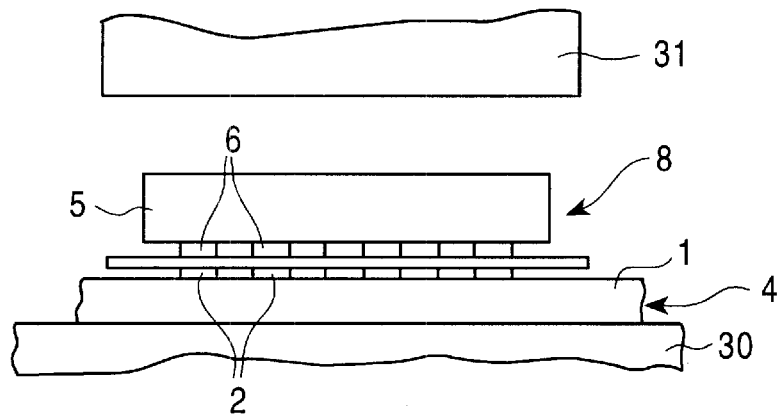
FIG. 8 is an explanatory view showing the electrical part mounting method of the second embodiment.

FIGS. 7 to 10 each show the electrical part mounting method of the second embodiment. In the mounting method, an electrical part 4, an ACF 10, and an electrical part 8 are laid on the flat support 30 in order, as shown in FIG. 8.

In the first step, the pressure head 31, which has been heated to about 220° C., is lowered close to the electrical part 8 via the moving speed control member at high speed (about 20 mm/sec).

Figure 9:
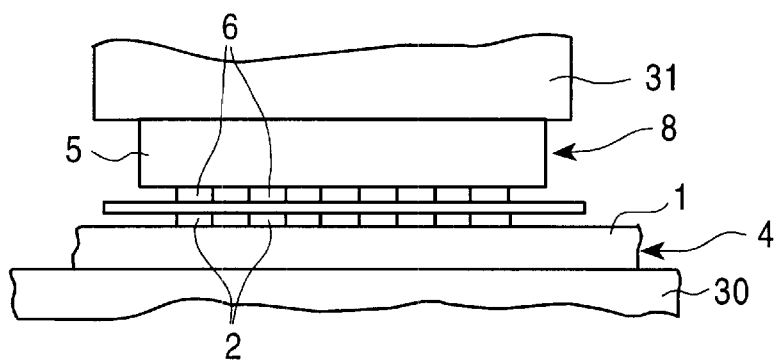
FIG. 9 is an explanatory view showing the electrical part mounting method of the second embodiment.

In the second step, the pressure head 31 is moved downward gently (at a speed of about 20 $\mu$m/sec) from the above-mentioned state via the moving speed control member until it is brought into light contact with the electrical part 8, as shown in FIG. 9.

This step substantially restricts shaking of the pressure head 31 during movement, and the flat surface thereof is brought into light contact with the electrical part 8 in parallel with the flat surface of the support 30.

In the third step, a first pressure (about 2.5 kg) is applied to the pressure head 31 for a required time through the pressure measuring member and the timer, thereby pressing the electrical part 8 by the pressure head 31, as shown in FIG. 9.

Since the electrical part 8 is pressed with the first pressure (about 2.5 kg) in this step, parallelism between the flat surface of the pressure head 31 and the flat surface of the support 30 is improved, and the pressure head 31 is moved downward while maintaining this parallel state.

In the fourth step, the electrical part 8 is pressed with a second pressure (about 8.0 kg) for a fixed time.

Then, the electrical part 8 is heated by the heated pressure head 31, and the ACF 10 is heated and liquefied by the heated electrical part 8.

Consequently, the pressure head 31 descends, the conductive particles 9 between the conductive wires 2 and 3 and the conductive members 6 and 7 are crushed, and the conductive wires 2 and 3 are electrically connected to the conductive members 6 and 7, respectively, as shown in FIG. 11B.

In the fifth step, the pressure head 31 is cooled.

In this step, the ACF 10 is set, the electrical parts 4 and 8 are bonded to each other, and the conductive wires 2 and 3 are connected to the conductive members 6 and 7, respectively, as shown in FIG. 11B.

Figure 10:
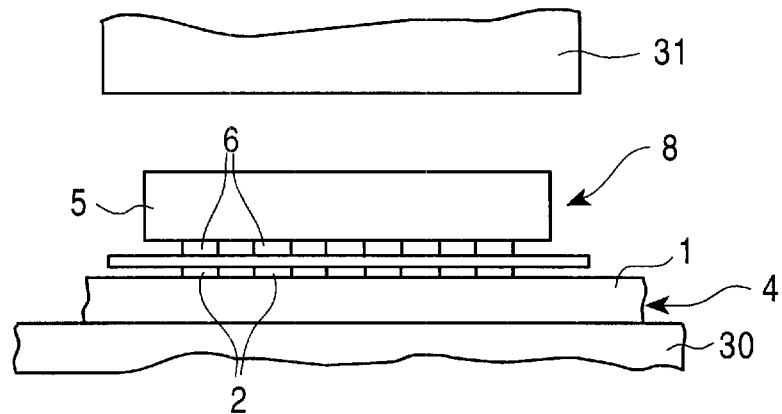
FIG. 10 is an explanatory view showing the electrical part mounting method of the second embodiment.

In the sixth step, the pressure head 31 is moved upward as shown in FIG. 10, and mounting of the electrical parts is completed.

An electrical part mounting method according to a third embodiment of the present invention will now be described with reference to FIGS. 13 to 16 in connection with the connecting structure shown in FIG. 11.

Figure 13:
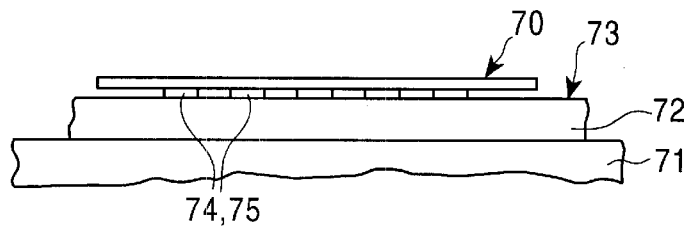
FIG. 13 is an explanatory view showing a first step in an electrical part mounting method according to a third embodiment of the present invention.

FIGS. 13 to 16 each show the electrical part mounting method of the third embodiment. In the first step of the mounting method, an ACF 70 is laid on conductive wires 74 and 75 formed on an insulating plate 72 that is placed on a flat support 71, as shown in FIG. 13.

Figure 14:
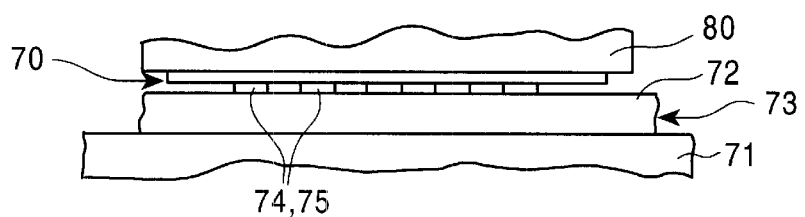
FIG. 14 is an explanatory view showing a second step in the electrical part mounting method of the third embodiment.

In the second step, as shown in FIG. 14, a pressure head 80 heated to 80° C. to 120° C. is moved downward, a flat surface of the pressure head 80 is brought into contact with the ACF 70, and the ACF 70 is lightly pressed by the pressure head 80.

Thus, the ACF 70 is turned into a semi-set viscous state while maintaining its original form like a film, and bonded to the insulating plate 72 in this semi-set state.

Figure 15:
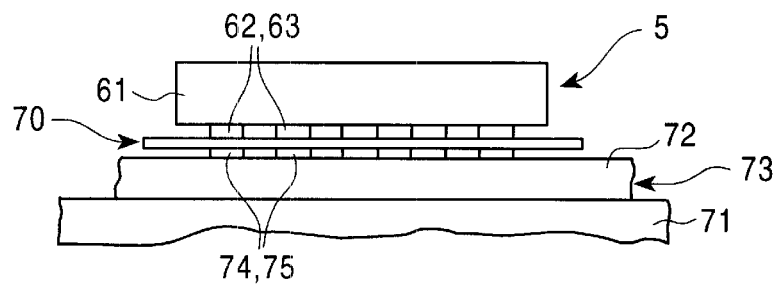
FIG. 15 is an explanatory view showing a third step in the electrical part mounting method of the third embodiment.

In the fourth step, another electric part 5 is, as shown in FIG. 15, laid on the semi-set ACF 70 so that conductive members 62 and 63 thereof are opposed to the conductive wires 74 and 75 of the insulating plate 71.

Figure 16:
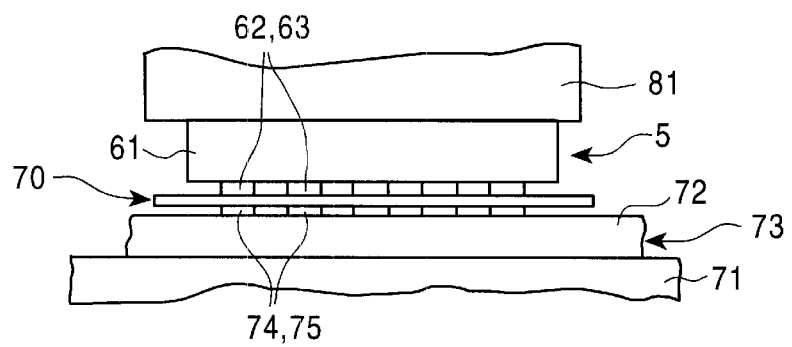
FIG. 16 is an explanatory view showing a fourth step in the electrical part mounting method of the third embodiment.
Figure 17:
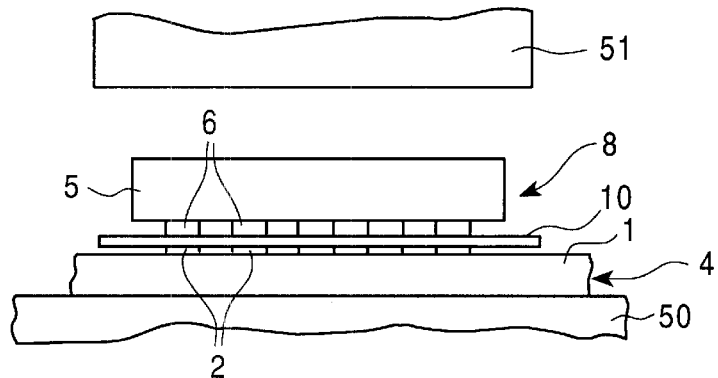
FIG. 17 is an explanatory view showing a conventional electrical part mounting apparatus and method.
Figure 18:
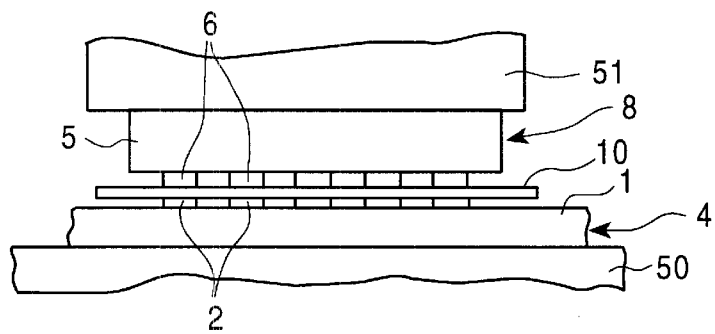
FIG. 18 is an explanatory view showing the conventional electrical part mounting apparatus and method.
Figure 19:
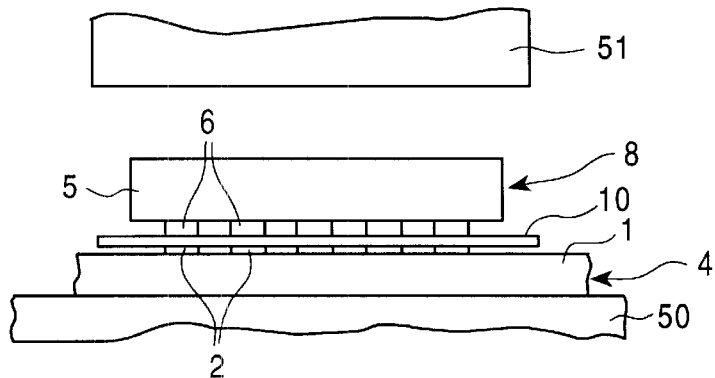
FIG. 19 is an explanatory view showing the conventional electrical part mounting apparatus and method.
Figure 20:
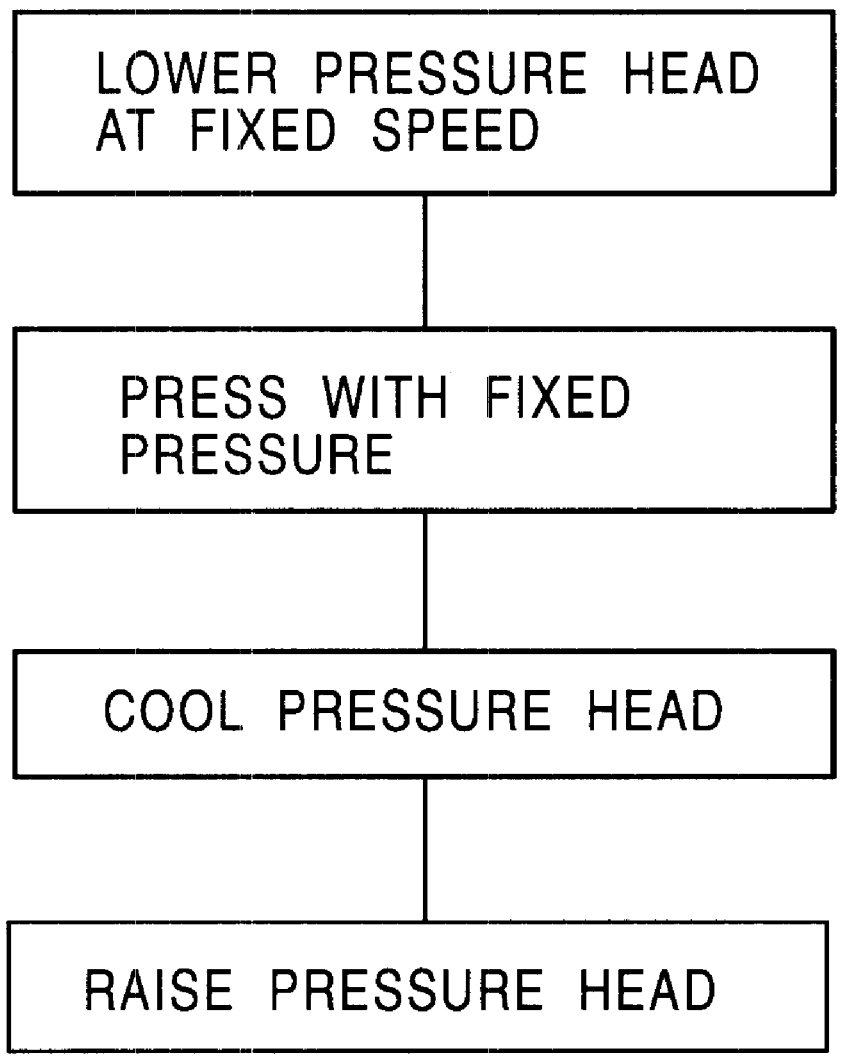
FIG. 20 is an explanatory view showing steps in the conventional electrical part mounting method.

In the fifth and final step, as shown in FIG. 16, a pressure head 81 heated to 180° C. to 250° C. is moved downward, and presses the electric part 5 with a flat surface thereof in contact with the electric part 5.

During pressing by the pressure head 81, the semi-set ACF 70, which functions as a cushion, is gradually stretched. This allows the pressure head 81 to accurately move in the vertical direction, and removes most air from between the electrical part 5 and the insulating plate 72.

After that, the electrical part 5 is heated by the pressure head 81 that has been heated to a higher temperature than the temperature required for semi-setting, and the semi-set ACF 70 is heated and liquefied by the heated electrical part 5.

At this time, the pressure head 81 is moved more gently than previously, conductive particles 9 between the conductive wires 74 and 75 and the conductive members 62 and 63 are crushed, and the conductive wires 74 and 75 are electrically connected to the conductive members 62 and 63, respectively.

When the heated pressure head 81 is cooled, the ACF 70 is set, and the electrical part 5 and the insulating plate 72 are bonded to each other. Then, the pressure head 81 is moved up, and mounting of the electrical parts is completed.

As mentioned above, since the electrical part mounting apparatus of the present invention includes a pressure measuring member for measuring the pressure of a pressure head, and a moving speed control member for controlling the moving speed of the pressure head, it is possible to provide a mounting apparatus suitable for connection between electrical parts that can freely change the pressure and the moving speed of a pressure head to desired values.

Since the electrical part mounting apparatus also includes a timer for measuring the pressing time or the heating time of the pressure head, and a temperature control member for controlling the temperature of a heater, it is possible to provide a mounting apparatus more suited for connection between electrical parts that can freely change the pressing time and the heating temperature of a pressure head.

Furthermore, according to the electrical part mounting method of the present invention, the electrical part is pressed by the pressure head while increasing the pressure to the required pressure gradually or stepwise, or the electrical part is first pressed and preheated by the pressure head with a first pressure and then pressed and regularly heated with a second pressure higher than the first pressure. Therefore, it is possible to improve parallelism between a support and a pressure head and to thereby reliably connect electrical parts.

When the first pressure of the pressure head is set about ⅓ of the second pressure, it is possible to offer good parallelism between a support and a pressure head and to thereby reliably connect electrical parts.

Since the pressure head is lowered close to an electrical part at high speed, and then brought into light contact with the electrical part, working efficiency and productivity are enhanced. Moreover, it is possible to restrict shaking of the pressure head in making contact with the electrical part, and to thereby reliably connect electrical parts.

Electrical parts are connected by semi-setting a thermosetting anisotropic conductive material, and then heating and pressing the semi-set thermosetting anisotropic conductive material. Therefore, it is possible to significantly reduce bubbles, to improve adhesion between the electrical parts, and to achieve reliable electrical connection.

Furthermore, since the electrical part mounting method includes the steps of forming a semi-set thermosetting anisotropic conductive material on an insulating plate, and heating and pressing an electrical part laid on the semi-set thermosetting anisotropic conductive material, air is removed from between two electrical parts, which makes it possible to significantly reduce bubbles, and to reliably connect the electrical parts. In addition, the semi-set thermosetting anisotropic conductive material functions as a cushion during movement of the pressure head, and allows the pressure head to accurately move in the vertical direction. Accordingly, it is possible to uniformly crush conductive particles, and to thereby achieve reliable electrical connection.

Since a thermosetting anisotropic conductive material is laid in the form of a film on the insulating plate and semi-set, operations are facilitated. Moreover, since the thermosetting anisotropic conductive film is bonded to the insulating plate, subsequent operations are easy to perform.

The temperature to heat the electrical part is higher than the heating temperature to semi-set the thermosetting anisotropic conductive material, which makes it possible to smoothly liquefy the thermosetting anisotropic conductive material and to uniformly crush conductive particles.

Still furthermore, since the thermosetting anisotropic conductive material is semi-set at 80° C. to 120° C. and liquefied at 180° C. to 250° C., it is possible to obtain a semi-set state of the thermosetting anisotropic conducting material in which it has moderate viscosity and great cushioning ability, and to smoothly liquefy the thermosetting anisotropic conductive material.

What is claimed is:

1. An electrical part mounting method comprising the steps of:

lowering at a speed of about 20 mm/second a pressure head having a flat lower surface that has been heated to about 220° C. to a location near an electrical part installed on a film of thermosetting anisotropic conductive material that includes an adhesive agent;

moving said pressure head downwardly at a speed of about 20 $\mu$m/second such that shaking of the pressure head is restricted, until said flat surface makes light contact with said electrical part while maintaining said pressure head parallel with said electrical part;

pressing said electrical part with a first pressure applied by said pressure head;

maintaining said first pressure on the electrical part for a fixed time period during which fixed time period the pressure head moves downwardly and remains parallel with said electrical part;

pressing said electrical part with a second pressure higher than said first pressure for a fixed time period; and heating said electrical part through said pressure head to a temperature that will change the adhesive agent for said thermosetting anisotropic conductive material into liquid allowing the pressure head to descend and the conductive material to flow thus completing electrical connections of the electric part.

2. An electrical part mounting method comprising the steps of:

laying a thermosetting anisotropic conductive material, in the form of a film, on an insulating plate having conductive wires;

moving a pressure head downward into contact with said thermosetting anisotropic conductive material and applying a light pressure, said pressure head being at a temperature of 80° C. to 120° C., such that said thermosetting anisotropic conductive material becomes semi-set;

raising the pressure head from contact with the semi-set thermosetting anisotropic conductive material;

laying an electrical part having conductive members on said semi-set thermosetting anisotropic conductive material such that said conductive wires and said conductive members are opposed;

moving the pressure head downwardly into contact with said electrical part; and heating and pressing said electrical part, by said pressure head, which has been heated to a temperature of 180° C. to 250° C., that is higher than the heating temperature that was applied to semi-set said thermosetting anisotropic conductive material, causing said film of thermosetting anisotropic conductive material to become liquefied and said conductive wires and said conductive members to become electrically connected.

3. An electrical part mounting method comprising the steps of:

lowering a pressure head having a flat lower surface that has been heated to about 220° C. to a location near an electrical part installed on a film of thermosetting anisotropic conductive material that includes an adhesive agent;

moving said pressure head downwardly such that shaking of the pressure head is restricted, until said flat surface makes light contact with said electrical part while maintaining said pressure head parallel with said electrical part;

pressing said electrical part with a first pressure applied by said pressure head;

maintaining said first pressure on the electrical part for a fixed time period during which fixed time period the pressure head moves downwardly and remains parallel with said electrical part;

pressing said electrical part with a second pressure higher than said first pressure for a fixed time period; and heating said electrical part through said pressure head to a temperature that will change the adhesive agent of said thermosetting anisotropic conductive material into liquid allowing the pressure head to descend and the conductive material to flow thus completing electrical connections of the electric part.

4. An electrical part mounting method according to claim 3, wherein the first pressure is about 1/3 of the second pressure.

* * * * *